US012402278B2

(12) United States Patent
Nagimov et al.

(10) Patent No.: US 12,402,278 B2
(45) Date of Patent: Aug. 26, 2025

(54) WASTE COLD RECUPERATION IN FUEL CELL BASED POWER GENERATION SYSTEMS FOR DATACENTERS

(71) Applicant: Microsoft Technology Licensing, LLC, Redmond, WA (US)

(72) Inventors: Ruslan Nagimov, Redmond, WA (US); Husam A. Alissa, Snoqualmie, WA (US); Mark Alan Monroe, Louisville, CO (US); Sean M. James, Olympia, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 234 days.

(21) Appl. No.: 18/065,254

(22) Filed: Dec. 13, 2022

(65) Prior Publication Data

US 2024/0206117 A1  Jun. 20, 2024

(51) Int. Cl.
*H05K 7/20* (2006.01)
*G06F 1/20* (2006.01)
(Continued)

(52) U.S. Cl.
CPC ......... *H05K 7/20327* (2013.01); *G06F 1/206* (2013.01); *H01M 8/04208* (2013.01);
(Continued)

(58) Field of Classification Search
CPC ........... H05K 7/20327; H05K 7/20009; H05K 7/20372; H05K 7/20381; G06F 1/206;
(Continued)

(56) References Cited

U.S. PATENT DOCUMENTS 10,785,891 B1   9/2020  Monroe et al.
11,266,038 B2   3/2022  Monroe et al.
(Continued)

FOREIGN PATENT DOCUMENTS

EP   2644508 A1   10/2013
EP   3346111 A1   7/2018
(Continued)

OTHER PUBLICATIONS

International Search Report and Written Opinion received for PCT Application No. PCT/US2023/036971, Feb. 22, 2024, 28 pages.
(Continued)

*Primary Examiner* — Miguel A Diaz
(74) *Attorney, Agent, or Firm* — Ranjeev Singh; Singh Law, PLLC

(57) ABSTRACT

Examples described in this disclosure relate to waste cold recuperation in fuel cell based power generation systems for datacenters. An example waste cold recuperation system includes a liquefied gas storage for supplying liquefied gas as a coolant to cool a first set of compute resources configurable to operate in a first cryogenic environment. The system is configurable to supply at least some of the vapor phase of the liquefied gas as a coolant to cool a second set of compute resources configurable to operate in a second cryogenic environment, resulting in the at least some of the vapor phase of the liquefied gas becoming a super-heated vapor phase of the liquefied gas. The system is configurable to supply the super-heated vapor phase of the liquefied gas as fuel to fuel cells for providing electrical power to a datacenter load including compute resources configurable to operate in a non-cryogenic environment.

20 Claims, 9 Drawing Sheets

(51) Int. Cl.
  *H01M 8/04082* (2016.01)
  *H01M 8/04746* (2016.01)
(52) U.S. Cl.
  CPC ... *H01M 8/04753* (2013.01); *H01M 8/04776* (2013.01); *H05K 7/20009* (2013.01); *H05K 7/20372* (2013.01); *H05K 7/20381* (2013.01); *H01M 2250/10* (2013.01)
(58) Field of Classification Search
  CPC ......... H01M 8/04208; H01M 8/04753; H01M 8/04776; H01M 2250/10
  See application file for complete search history.

(56) References Cited

U.S. PATENT DOCUMENTS

| | | | |
|---|---|---|---|
| 2012/0216520 | A1 | 8/2012 | Chen et al. |
| 2013/0163193 | A1 | 6/2013 | Ballantine et al. |
| 2014/0183957 | A1* | 7/2014 | Duchesneau ......... F01K 13/006 307/64 |
| 2019/0320557 | A1* | 10/2019 | Christiansen ........ H05K 7/1427 |
| 2020/0263831 | A1 | 8/2020 | Fu |
| 2022/0352750 | A1 | 11/2022 | Nagimov et al. |

FOREIGN PATENT DOCUMENTS

| | | |
|---|---|---|
| EP | 3673204 B1 | 11/2022 |
| KR | 20220036025 A | 3/2022 |
| KR | 20220077777 A | 6/2022 |
| KR | 102560157 B1 | 7/2023 |
| KR | 20230138230 A | 10/2023 |
| WO | 9942706 A1 | 8/1999 |
| WO | 2013066558 A1 | 5/2013 |
| WO | 2013130557 A1 | 9/2013 |

OTHER PUBLICATIONS

"Thermal Energy Storage System", In Book of Thermal Energy Storage Technologies for Sustainability, 2014, 8 Pages.

Huttermann, et al., "Investigation of a Liquid Air Energy Storage (LAES) System with Different Cryogenic Heat Storage Devices", In Journal of Energy Procedia, vol. 158, Feb. 1, 2019, pp. 4410-4415.

International Preliminary Report on Patentability (Chapter I) received for PCT Application No. PCT/US2023/036971, mailed on Jun. 26, 2025, 22 Pages.

* cited by examiner

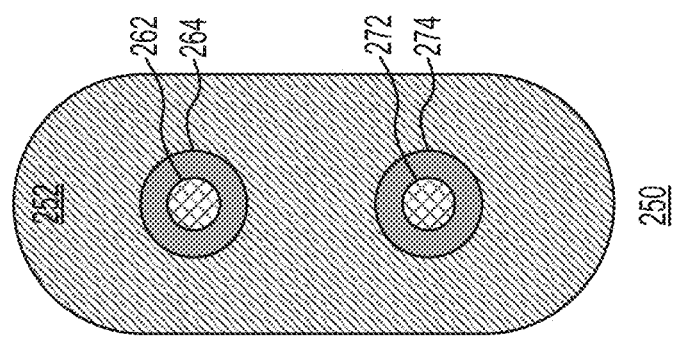
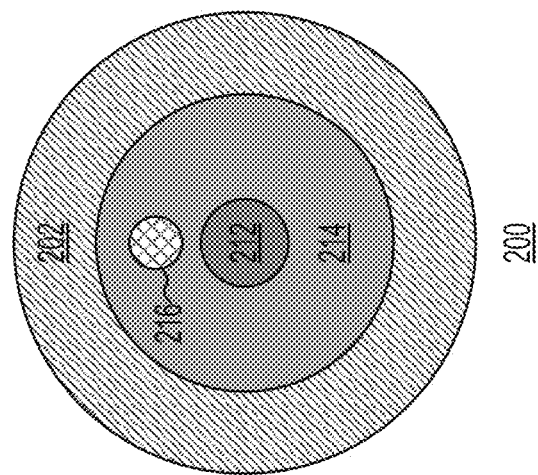
FIG. 2

SUPPLYING LIQUEFIED GAS TO A FIRST SET OF COMPUTE RESOURCES CONFIGURABLE TO OPERATE IN A FIRST CRYOGENIC ENVIRONMENT WITHIN A FIRST TEMPERATURE RANGE FROM A FIRST TEMPERATURE VALUE TO A SECOND TEMPERATURE VALUE HIGHER THAN THE FIRST TEMPERATURE VALUE, WHERE THE LIQUEFIED GAS IS SUPPLIED AS A COOLANT TO COOL THE FIRST SET OF COMPUTE RESOURCES, RESULTING IN AT LEAST SOME OF THE LIQUEFIED GAS BECOMING A VAPOR PHASE OF THE LIQUEFIED GAS

810

SUPPLYING AT LEAST SOME OF THE VAPOR PHASE OF THE LIQUEFIED GAS TO A SECOND SET OF COMPUTE RESOURCES CONFIGURABLE TO OPERATE IN A SECOND CRYOGENIC ENVIRONMENT WITHIN A SECOND TEMPERATURE RANGE FROM A THIRD TEMPERATURE VALUE TO A FOURTH TEMPERATURE VALUE HIGHER THAN THE THIRD TEMPERATURE VALUE, WHERE THE THIRD TEMPERATURE VALUE IS EQUAL TO OR HIGHER THAN THE SECOND TEMPERATURE VALUE, AND WHERE THE AT LEAST SOME OF THE VAPOR PHASE OF THE LIQUEFIED GAS IS SUPPLIED AS A COOLANT TO COOL THE SECOND SET OF COMPUTE RESOURCES, RESULTING IN THE AT LEAST SOME OF THE VAPOR PHASE OF THE LIQUEFIED GAS BECOMING A SUPER-HEATED VAPOR PHASE OF THE LIQUEFIED GAS

820

SUPPLYING AT LEAST SOME OF THE SUPER-HEATED VAPOR PHASE OF THE LIQUEFIED GAS AS FUEL TO FUEL CELLS FOR PROVIDING ELECTRICAL POWER TO A DATACENTER LOAD INCLUDING COMPUTE RESOURCES CONFIGURABLE TO OPERATE IN A NON-CRYOGENIC ENVIRONMENT

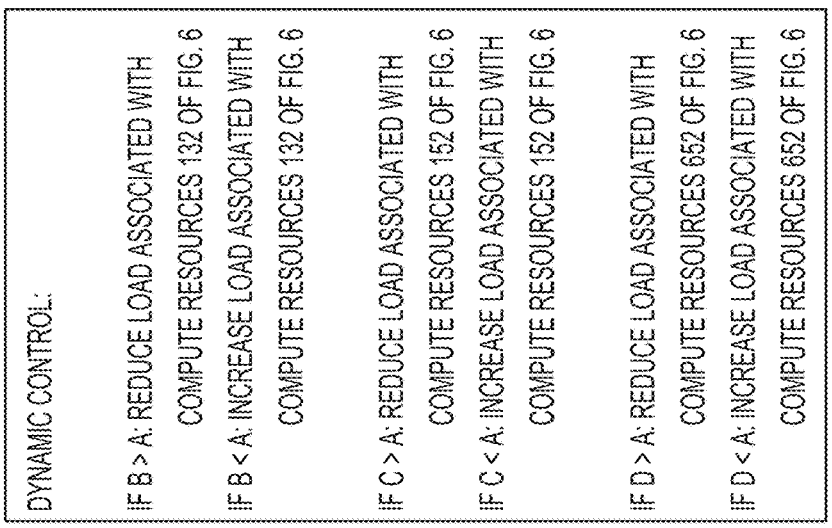
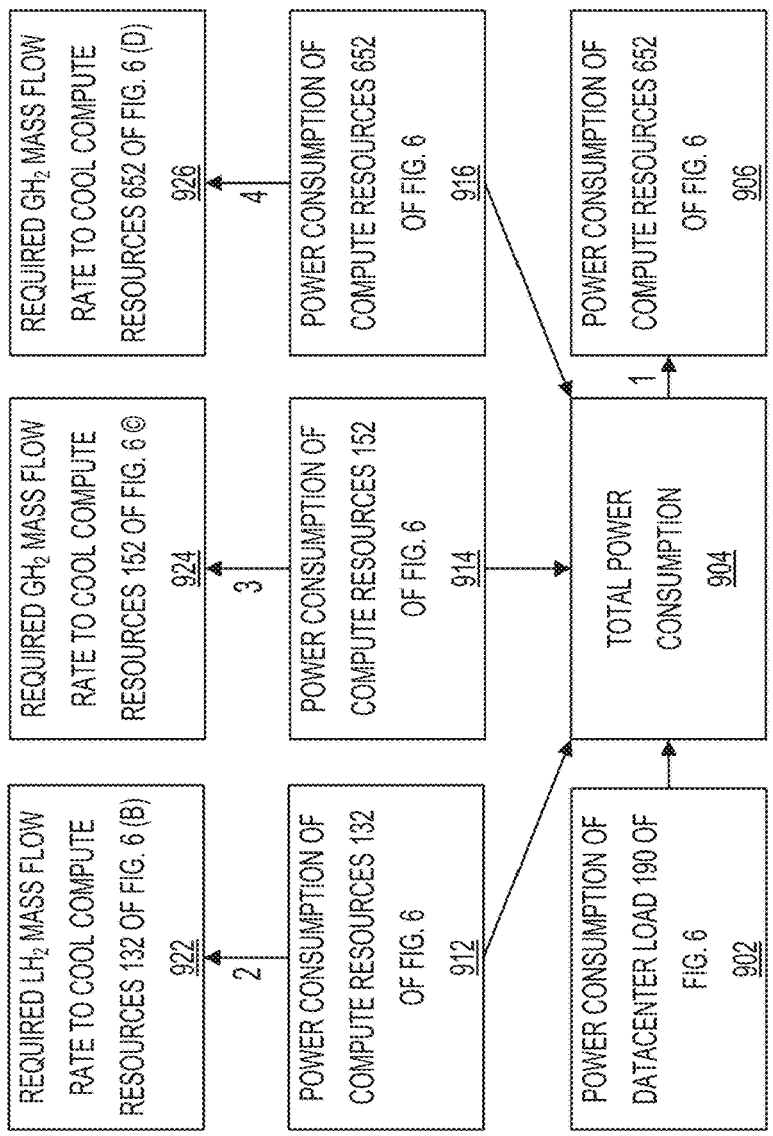
FIG. 9

WASTE COLD RECUPERATION IN FUEL CELL BASED POWER GENERATION SYSTEMS FOR DATACENTERS

BACKGROUND

Datacenter deployment is accelerating in order to meet rising demand for computing, communication, and storage resources. However, efficient scaling of datacenter capacity is being constrained by the traditional power generation architectures used for the distribution, delivery, and storage of energy. In addition, datacenters face significant costs and inefficiencies related to both power generation and energy storage. In order to meet high availability requirements, uninterruptible power supply (UPS) systems and diesel generators are used for short-term and long-term energy storage, respectively. UPS systems are typically based on traditional rechargeable batteries and therefore have limited life due to their inherent capacity loss because of the charging and discharging cycles. Moreover, diesel generators, which are used for standby power generation, operate at low efficiencies, require regular maintenance, and negatively impact the environment because of the reliance of an external supply of diesel fuel.

Some datacenters are using hydrogen fuel cells for power generation. Such hydrogen fuel cells use liquefied hydrogen, which has a very high energy density, resulting in compact storage systems. However, in traditional liquid hydrogen storage systems, the latent heat of hydrogen vaporization and the sensible heat of cold hydrogen gas are lost as "waste cold." Thus, there is a need for improved power generation systems for use with modern datacenters.

SUMMARY

In one example, the present disclosure relates to a waste cold recuperation system including a liquefied gas storage for supplying liquefied gas as a coolant to cool a first set of compute resources configurable to operate in a first cryogenic environment within a first temperature range from a first temperature value to a second temperature value higher than the first temperature value, resulting in at least some of the liquid phase of the liquefied gas becoming a vapor phase of the liquefied gas. The waste cold recuperation system may further be configurable to supply at least some of the vapor phase of the liquefied gas as a coolant to cool a second set of compute resources configurable to operate in a second cryogenic environment within a second temperature range from a third temperature value to a fourth temperature value higher than the third temperature value, where the third temperature value is equal to or higher than the second temperature value, resulting in the at least some of the vapor phase of the liquefied gas becoming a super-heated vapor phase of the liquefied gas.

The waste cold recuperation system may further be configurable to supply at least some of the super-heated vapor phase of the liquefied gas as fuel to fuel cells for providing electrical power to a datacenter load including compute resources configurable to operate in a non-cryogenic environment.

In another example, the present disclosure relates to a method for operating a waste cold recuperation system for recovering energy from liquefied gas. The method may include supplying the liquefied gas to a first set of compute resources configurable to operate in a first cryogenic environment within a first temperature range from a first temperature value to a second temperature value higher than the first temperature value, where the liquefied gas is supplied as a coolant to cool the first set of compute resources, resulting in at least some of the liquefied gas becoming a vapor phase of the liquefied gas.

The method may further include supplying at least some of the vapor phase of the liquefied gas to a second set of compute resources configurable to operate in a second cryogenic environment within a second temperature range from a third temperature value to a fourth temperature value higher than the third temperature value, where the third temperature value is equal to or higher than the second temperature value, and where the at least some of the vapor phase of the liquefied gas is supplied as a coolant to cool the second set of compute resources, resulting in the at least some of the vapor phase of the liquefied gas becoming a super-heated vapor phase of the liquefied gas. The method may further include supplying at least some of the super-heated vapor phase of the liquefied gas as fuel to fuel cells for providing electrical power to a datacenter load including compute resources configurable to operate in a non-cryogenic environment.

In yet another example, the present disclosure relates to a waste cold recuperation system including a first set of compute resources configured to operate in a first cryogenic environment within a first temperature range from 20 kelvin to 77 kelvin. The waste cold recuperation system may further include a second set of compute resources configured to operate in a second cryogenic environment within a second temperature range from 77 kelvin to 100 kelvin.

Liquefied hydrogen may be supplied as a coolant to cool the first set of compute resources, resulting in at least some of the liquefied hydrogen becoming a vapor phase of the liquefied hydrogen. At least the vapor phase of the liquefied hydrogen may be supplied as a coolant to cool the second set of compute resources, resulting in the vapor phase of the liquefied hydrogen becoming a super-heated vapor phase of the liquefied hydrogen. The super-heated vapor phase of the liquefied hydrogen may be fed as fuel to hydrogen fuel cells for providing electrical power to a datacenter load including compute resources configured to operate in a non-cryogenic environment.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 2 shows cross-section views of two different vacuum-insulated cryostat segments for use with the fuel cell based power generation system of FIG. 1 in accordance with one example;

FIG. 8 shows a flowchart of a method associated with waste cold recuperation in a fuel cell based power generation system in accordance with one example; and FIG. 9 shows example dynamic control of waste cold recuperation in a fuel cell based power generation system environment including a datacenter load.

DETAILED DESCRIPTION

Examples described in this disclosure relate to waste cold recuperation in fuel cell based power generation systems for datacenters. As explained earlier, traditional fuel cell based power generation systems for datacenters may use liquefied hydrogen. The liquefied hydrogen is traditionally vaporized and warmed up in a series of ambient vaporizers. A large portion of the liquid hydrogen energy is stored thermally as a cryogen, which is not recovered in such conventional fuel cell based power generation systems. This is because in such systems, the latent heat of hydrogen vaporization and the sensible heat of cold hydrogen gas are lost as waste cold. This constitutes an inefficiency in the energy supply chain for use with datacenter loads since hydrogen liquefication is an energy-intensive process. Similar inefficiencies occur when liquefied gasses other than hydrogen are used as fuel for the fuel cells. As an example, fuel cells can be fed methane. Any liquefied gas that requires storage at a low enough temperature, requiring heating prior to being fed as fuel to fuel cells, can be used as part of the waste cold recuperation systems described herein.

To address the inefficiency in the energy supply chain for use with datacenter loads problems, the embodiments of the disclosed systems in this disclosure use cryogenically-cooled technologies (e.g., cryogenically cooled complimentary metal-oxide-semiconductor (CMOS) computing systems, high-temperature superconductors for power transmission, and quantum computing systems) as consumers of the "waste cold." Various temperature levels associated with the different cryogenically-cooled technologies allow for full utilization of the recuperated waste cold. Thus, the integration of the proposed systems in the context of fuel cell powered datacenters allows for efficient recuperation of waste cold.

Figure 1:
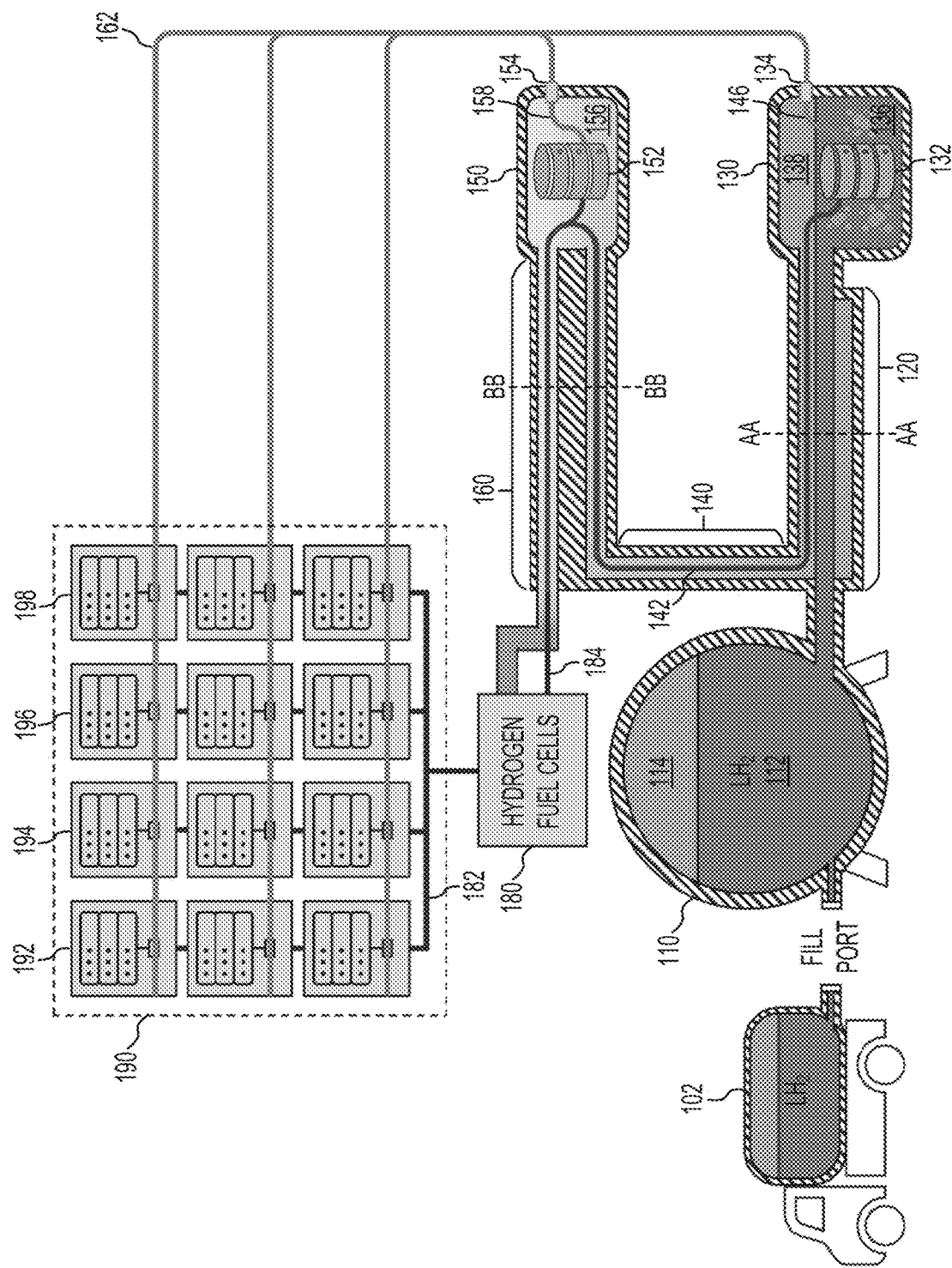
FIG. 1 shows a diagram of one example of waste cold recuperation in a fuel cell based power generation system environment including a datacenter load.

FIG. 1 shows a diagram of one example of waste cold recuperation in a fuel cell based power generation system environment 100 including a datacenter load 190. System environment 100 may include a liquefied hydrogen storage 110, which may be supplied liquefied hydrogen via a fill port. A transport vehicle 102 for transporting liquefied hydrogen may be coupled to the fill port for receiving liquefied hydrogen for storage as part of liquefied hydrogen storage 110. Other types of storage, including underground storage may also be used for storing energy in the form of liquefied hydrogen. Moreover, other means for transporting, including pipes, may be used for transporting liquefied hydrogen from another location to liquefied hydrogen storage 110. As used herein the term "pipe" includes, but is not limited to, any pipe structures, connectors, joints, or other elements that may be used to move any gas, air, or any liquid between at least two or more components. Although not shown in FIG. 1, valves and pumps in combination with pipes may be used to control and regulate the movement and storage of hydrogen in liquefied hydrogen storage 110. Liquefied hydrogen storage 110 may include both a liquid phase 112 and a vapor phase 114 of hydrogen. In addition, although not shown in FIG. 1, liquefied hydrogen storage 110 may include boil-off gas discharge lines and other mechanisms for ensuring proper operation of liquefied hydrogen storage 110. Liquefied hydrogen storage 110 may be configured as a vacuum-insulated housing to ensure that the liquid hydrogen is maintained at approximately 20 kelvin with the vacuum having a pressure in a range of $10^{-3}$ Torr to $10^{-10}$ Torr.

With continued reference to FIG. 1, system environment 100 may further include datacenter load 190 which may include compute, storage, and networking resources organized to offer various services via cloud computing models or other service models. Datacenter load 190 may include compute resources organized in groups of resources (e.g., compute resources 192, compute resources 194, compute resources 196, and compute resources 198). Such compute resources may correspond to racks of servers interconnected via high-speed networks, including high-speed switches and routers. In this example, these compute resources may be powered by hydrogen fuel cells 180. As an example, without limitation, the compute resources may include at least one of (or any appropriate combination of) a central-processing functionality, a graphics-processing functionality, an artificial-intelligence functionality, a gate-array functionality, a memory functionality, or a bus-interface-management functionality. Datacenter load 190 may further include other equipment powered by hydrogen fuel cells 180, including datacenter management hardware/software, storage resources, load balancers, networking switches, gateways, power supply units, and other equipment. Storage resources may comprise memory components, including any of non-volatile or volatile memory components. Hydrogen fuel cells 180 may supply power via cables (e.g., DC power lines 182) to datacenter load 190, including the compute resources. The compute resources powered by hydrogen fuel cells 180 may be configured to operate in a non-cryogenic environment. As used herein, the term "cryogenic environment" means an environment having a temperature between 20 kelvin to 100 kelvin and having a vacuum with a pressure in a range of $10^{-3}$ Torr to $10^{-10}$ Torr. The term "non-cryogenic environment" means an environment having a temperature above 250 kelvin and having atmospheric pressure.

Still referring to FIG. 1, hydrogen fuel cells 180 may be implemented as proton exchange membrane cells. In one example, such hydrogen fuel cells 180 may include one or more anodes and one or more cathodes arranged around an electrolyte. Hydrogen may be fed as fuel to the anode and air may be fed to the cathode. A catalyst at the anode may separate the hydrogen molecules into protons and electrons. The electrons may create the flow of electricity and thus provide DC power to datacenter load 190. The protons may migrate through the electrolyte to the cathode and produce water and heat after combining with oxygen. As explained earlier, in traditional use of hydrogen fuel cells, liquefied hydrogen is vaporized using heat and then the warm gaseous hydrogen is fed to fuel cells to generate power.

As shown in FIG. 1, as part of the example system environment 100, liquid hydrogen storage 110 may be coupled via a vacuum-insulated cryostat segment 120 to a vacuum-insulated cryostat 130 housing compute resources 132 that are configured to operate in a cryogenic environment. In this example, compute resources 132 may be configured to operate in an environment with a temperature of approximately 20 kelvin. Vacuum-insulated cryostat 130 housing compute resources 132 may be coupled via a vacuum-insulated cryostat segment 140 and a portion of another vacuum-insulated cryostat segment 160 to another vacuum-insulated cryostat 150 housing compute resources 152, which are also configured to operate in a cryogenic environment. In this example, compute resources 152 may operate in an environment with a temperature of approximately 80 kelvin. Vacuum-insulated cryostat 150 may be coupled via vacuum-insulated cryostat segment 160 to hydrogen fuel cells 180 (located outside the cryogenic environment). Although FIG. 1 shows two different types of compute resources (e.g., compute resources 132 and compute resources 152) that have different cooling requirements, system environment 100 is not limited to just these compute resources with certain cooling requirements. Other types of computing resources having cooling requirements different from the compute resources described herein may also be incorporated into system environment 100. As an example, such compute resources may operate in a cryogenic environment having different temperature ranges than described with respect to compute resources 132 and compute resources 152. Moreover, the temperature of the cryogenic environment for compute resources 152 can vary if compute resources 132 begin to consume more energy than originally anticipated. As a result, the temperature associated with the vapor phase of the liquefied gas can increase. As explained later, such variations in the temperature of the vapor phase can be sensed and then controlled by increasing or decreasing the flow rate of the liquefied gas. As an example, liquefied gas may be provided at a higher flow rate to compensate for the higher consumption of energy by compute resources 132 until the temperature associated with the cryogenic environment for compute resources 152 reaches the desired operating range or value. Other sources of cooling for compute resources 152 can also be deployed in certain circumstances.

With continued reference to FIG. 1, the power generated by hydrogen fuel cells 180 may be supplied to the various compute resources via different types of DC power lines, depending on whether the compute resources are cold-compute resources or not. As an example, hydrogen fuel cells 180 may generate power that may be coupled via a set of DC power lines 182, which are configured to operate at an ambient temperature, to compute resources in datacenter load 190. Hydrogen fuel cells 180 may further be coupled via other types of DC power lines to compute resources 132 and compute resources 152 operating in the cryogenic environment. In one example, high-temperature superconductors-based interconnects may be used as DC power lines (e.g., DC power line 142) to supply power to compute resources 132 and 152. The HTS-based interconnects may include a high-temperature superconductor layer formed over a substrate layer. Any portions of the HTS-based interconnects coupled to a warm DC power line may further include a metallic layer. The substrate layer may be formed using yttria-stabilized zirconia (YSZ) or as a polyimide film, such as Kapton. YSZ may be coated on a glass substrate or another type of substrate to form the substrate layer. The high-temperature superconductor layer may be formed using certain copper oxides or rare-earth (Re) metal compounds. As an example, the high-temperature superconductor layer may be formed using yttrium barium copper oxides (YBCOs), bismuth strontium calcium copper oxides (BSCCOs), or rare-earth metal oxides (REBCOs). The metallic layer may be formed using gold (Au), silver (Ag), or copper (Cu). Other appropriate combinations of materials may also be used to form the cold DC power lines that are used to interconnect the cold compute resources.

At least some of the liquefied hydrogen when used for cooling compute resources 132 boils and its phase changes from a liquid phase 136 to a vapor phase 138. The vapor phase 138 is then used to cool compute resources 152, which results in further warming up of the vapor phase 138 resulting in super-heated vapor phase 156. Depending on the amount of warming caused as a result of the cooling, the super-heated vapor phase 156 may reach an ambient temperature. If it does, then the super-heated vapor phase 156 of the liquefied hydrogen is fed as fuel to hydrogen fuel cells 180. Alternatively, in some circumstances, the super-heated vapor phase 156 may require further warming up to bring its temperature up to the ambient temperature before feeding the hydrogen gas as fuel to the fuel cells. Table 1 below shows an example calculation for one way of determining the amount of cooling, which otherwise would have been wasted, that can be provided to compute resources 132 and compute resources 152, respectively. This example assumes that compute resources 132 that are removing heat from the saturated liquid phase of hydrogen are operating in a cryogenic environment at a temperature of 20 kelvin and that compute resources 152 that are removing heat from the saturated vapor phase of hydrogen are operating in a cryogenic environment at a temperature of 80 kelvin. In the example calculation shown below, the 20 kelvin temperature is referred to as LH2 temperatures and the 80 kelvin temperature is referred to as HTS temperatures.

TABLE 21

| Constants | kJ := 1000 J, MJ := $10^6$ J |
|---|---|
| Atmospheric Pressure and Temperature (ATM) HTS Temperature | $P_{atm}$ := 101325 Pa $T_{env}$ := 300 K $T_{HTS}$ := 80 K |
| Density of the Saturated Vapor (SV) Phase of Hydrogen at ATM | $\rho_{H2.SV} := \rho_{H2.SV.calc} = 1.332 \frac{kg}{m^3}$ |
| Enthalpy of the SV Phase of Hydrogen at ATM | $h_{H2.SV} := h_{H2.SV.calc} = 0.449 \frac{MJ}{kg}$ |
| Density of the Saturated Liquid (SL) Phase of Hydrogen at ATM | $\rho_{H2.SL} := \rho_{H2.SL.calc} = 70.848 \frac{kg}{m^3}$ |
| Enthalpy of the SL Phase of Hydrogen at ATM | $h_{H2.SL} := h_{H2.SL.calc} = 3.715 \times 10^{-12} \frac{MJ}{kg}$ |
| Temperature of the SL Phase of Hydrogen at ATM | $T_{H2.SL} := h_{H2.SL.calc} = 20.369 \frac{MJ}{kg}$ |
| Latent Heat of Hydrogen at ATM | $r_{H2} := h_{H2.SV} - h_{H2.SL} = 0.449 \frac{MJ}{kg}$ |
| Enthalpy of Hydrogen at ATM | $h_{H2.atm} := h_{H2.atm.calc} = 3.958 \times 10^3 \cdot \frac{kJ}{kg}$ |
| Enthalpy of Hydrogen at HTS Temperature | $h_{H2.BTS} := h_{H2.BTS.calc} = 1.085 \frac{MJ}{kg}$ |

TABLE 21-continued

| Constants | kJ := 1000 J, MJ := $10^6$ J |
|---|---|
| Hydrogen Energy Density | $e_{H2} := 120 \frac{MJ}{kg} \cdot 60\% = 72 \cdot \frac{MJ}{kg}$ |
| Cooling Available at the Liquefied Hydrogen Temperatures | $\frac{h_{H2.SB} - h_{H2.SL}}{e_{H2}} = 0.623\%$ |
| Cooling Available at the HTS Temperatures | $\frac{h_{H2.HTS} - h_{H2.SV}}{e_{H2}} = 0.884\%$ |

In the context of table 1, some of the calculations include values that have been sourced from a database to ensure precision and accuracy. In the above table, enthalpy of hydrogen for calculation purposes is defined in a manner that the enthalpy value of hydrogen is approximately zero when hydrogen is at the atmospheric pressure and in a super-heated (e.g., boiling) condition. Latent heat in this calculation is the difference between the enthalpy of the saturated liquid phase of hydrogen and the saturated vapor phase of hydrogen. Enthalpy corresponds to the combination of the potential energy and the kinetic energy of the hydrogen molecules. In sum, enthalpy is a parameter that relates to the total usable internal energy of a gas like hydrogen at a certain temperature. The latent heat value in this example shows the amount of energy needed for converting 1 kilogram of liquefied hydrogen from the liquid phase to the vapor phase. Once the hydrogen energy density has been calculated, the cooling available at liquid hydrogen temperatures and the cooling available at the HTS temperatures can be calculated as shown in the bottom two rows of table 1 above. From these equations, one can correlate the amount of waste cold recuperation for the respective compute resources (e.g., compute resources 132 and compute resources 152) in relation to the amount of power generated by the hydrogen fuel cells.

In other words, the percentages in the bottom two rows of table 1 above indicate how much cooling a given amount of hydrogen produces, while traversing through the system, as a fraction of energy produced by the hydrogen fuel cells when they are fed that same given amount of hydrogen. These percentages allow datacenter designers to ensure proper operation because the amount of deployed power that is consumed by the datacenter load is measured in megawatts. The calculations above indicate that a datacenter load will consume approximately 98% of all the power that hydrogen fuel cells produce. To maintain the balance and equilibrium of power, the cooling capacities of the compute resources (e.g., compute resources 132 and compute resources 152) are expressed as a percentage of the power produced by the hydrogen fuel cells. This allows one to calculate the maximum amount of power that can be delivered to the cold compute resources (e.g., compute resources 132 and compute resources 152) without disturbing the equilibrium. Thus, in system environment 100, compute resources 132 (operating in a cryogenic environment having a temperature of 20 kelvin) could consume up to approximately 0.6% of the total power generated by the hydrogen fuel cells (e.g., hydrogen fuel cells 180) and compute resources 152 (operating in a cryogenic environment having a temperature of 80 kelvin) could consume up to approximately 0.8% of the total power generated by the hydrogen fuel cells. All of the remaining power is routed to the datacenter load 190.

Still referring to FIG. 1, vacuum-insulated cryostat 130 may include a fiber-optic feed-through 134 for optical communication between compute resources 132 and one or more of compute resources 192, compute resources 194, compute resources 196, and compute resources 198 via optical network 162. Similarly, vacuum-insulated cryostat 150 may include a fiber-optic feed-through 154 for optical communication between compute resources 152 and one or more of compute resources 192, compute resources 194, compute resources 196, and compute resources 198 via optical network 162. Fiber-optic feed-throughs may allow the coupling of optical fibers carrying signals from (or to) the cryogenic environment to (or from) the non-cryogenic environment. Fiber-optic feed-throughs may provide optical sub-systems and a vacuum seal such that the two environments can exchange signals without compromising the low pressure and the lower temperatures in the cryogenic environment.

Although FIG. 1 shows a certain number of components of system environment 100 arranged in a certain manner, there could be more or fewer number of components arranged differently. As an example, although not shown in FIG. 1, system environment 100 may include circulation pumps, temperature sensors, pressure sensors, level sensors, liquid/vapor fraction sensors, valves, pressure actuators, and/or other components, as needed. In addition, as described later with respect to FIG. 7 a control system may be used to control these components based on telemetry from the various sensors. The control system may provide set point values or other control information to enable control of system environment 100. Moreover, instead of hydrogen, the fuel cells can be fed methane. Any liquefied gas that requires storage at a low enough temperature, requiring heating prior to being fed as fuel to fuel cells, can be used as part of the waste cold recuperation systems described herein. Another example of such liquefied gas is liquefied natural gas (LNG) and variants thereof. Moreover, compute resources 130 may be configured to operate at other temperatures, as well, as long as those temperatures are below both the ambient temperature and the temperature associated with compute resources 152. In sum, as long as there is a certain thermal hierarchy in terms of the temperature of the cold liquefied gas to the temperature of the super-heated vapor phase of the gas fed as fuel to the fuel cells in a system environment 100 of FIG. 1 or the like, waste cold can be recuperated.

FIG. 2 shows cross-section views of two different vacuum-insulated cryostat segments for use with the fuel cell based power generation system of FIG. 1 in accordance with one example. Cross-section view 200 corresponds to a view of a cross-section of vacuum-insulated cryostat segment 120 along line AA-AA as shown in FIG. 1. Cross-section view 200 shows a cross-section of vacuum insulation layer 202. Cross-section view 200 further shows a cross-section of a pipe 214 that acts as a return line for the hydrogen vapor. Cross-section view 200 further shows a cross-section of a pipe 212 that is used to supply liquid hydrogen. In addition, cross-section view 200 shows a cross-section of a high-temperature superconducting DC power cable 216. As explained earlier, such a high-temperature superconducting DC power cable may be implemented using HTS-based interconnects.

With continued reference to FIG. 2, cross-section view 250 corresponds to a view of a cross-section of vacuum-insulated cryostat segment 160 along line BB-BB as shown in FIG. 1. Cross-section view 250 shows a cross-section of vacuum insulation layer 252. Cross-section view 250 further shows a cross-section of a pipe 264 that acts as a return line for the hydrogen vapor. Cross-section view 250 further shows a cross-section of a pipe 274 that also acts as a return line for the hydrogen vapor. In addition, cross-section view 250 shows a cross-section of a high-temperature superconducting DC power cable 262 enclosed by pipe 264 and a cross-section of another high-temperature superconducting DC power cable 272 enclosed by pipe 274. As explained earlier, such high-temperature superconducting DC power cables may be implemented using HTS-based interconnects. Although FIG. 2 shows a certain number of components of the vacuum-insulated cryostat segments that are arranged in a certain manner, there could be more or fewer number of components arranged differently.

Figure 3:
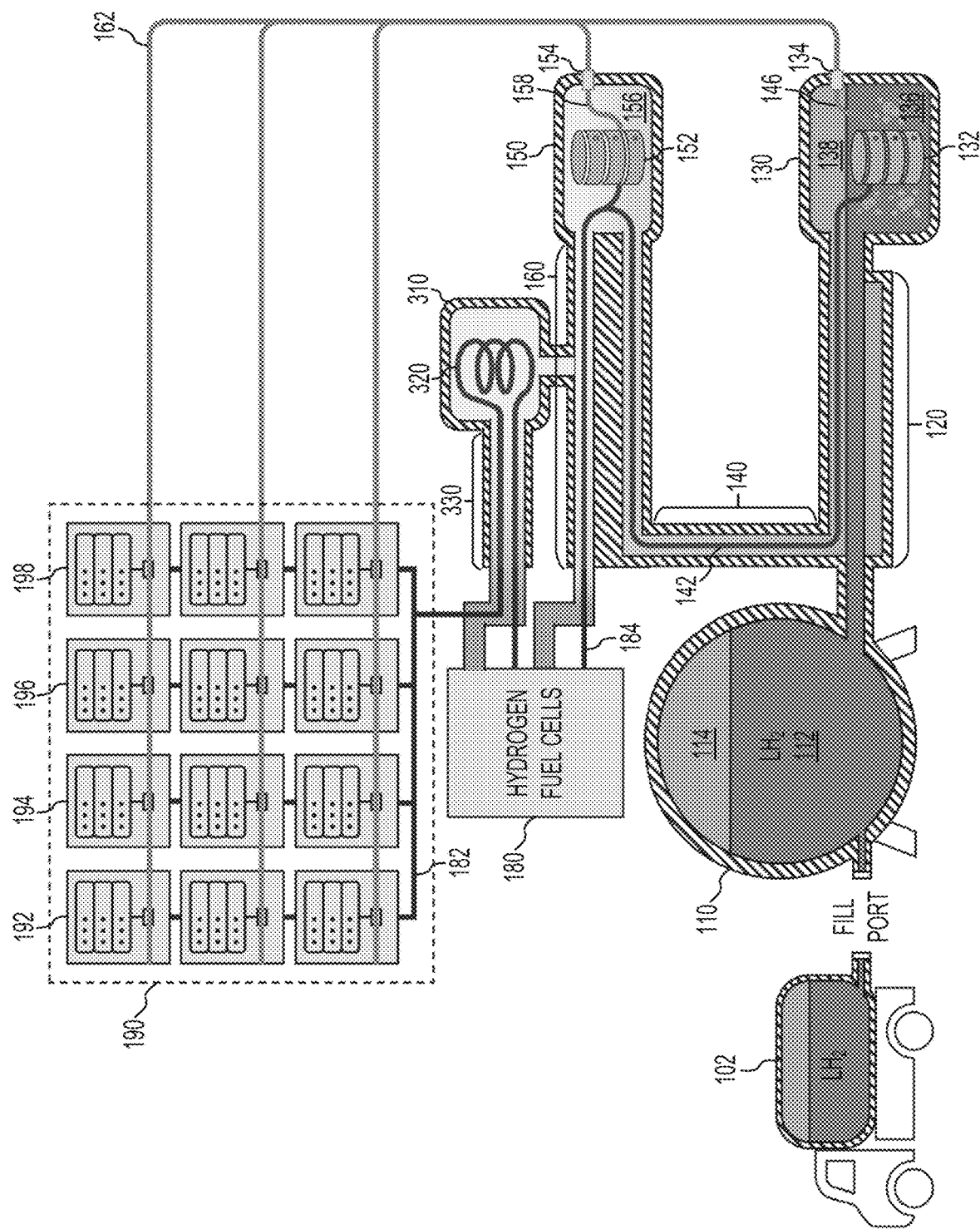
FIG. 3 shows a diagram of another example of waste cold recuperation in a fuel cell based power generation system environment including a datacenter load.

FIG. 3 shows a diagram of another example of waste cold recuperation in a fuel cell based power generation system environment 300 including a datacenter load 190. System environment 300 includes similar components as described earlier with respect to system environment 100 of FIG. 1. In those instances where the components are identical or substantially similar with respect to FIG. 1 and FIG. 3, the same reference numbers as used in FIG. 1 are used in FIG. 3. Accordingly, those components are not described in detail again with respect to system environment 300. This example of waste cold recuperation in a fuel cell based power generation system environment 300 includes a superconducting magnetic energy storage (SMES) system 310, which is also passively cooled by the waste cold. SMES system 310 includes a superconductor coil 320, which is configured to store energy in the form of a magnetic field generated by the current flowing in superconductor coil 320. The stored energy can be released by discharging the coil. In one example, the coil may be made of niobium-titanium (NbTi) alloy-based filaments. Other combinations of materials may also be used. SMES system 310 is configured to receive power generated by the fuel cells (e.g., hydrogen fuel cells 180) and discharge the stored energy to power datacenter load 190. Although FIG. 3 shows a certain number of components of system environment 300 arranged in a certain manner, there could be more or fewer number of components arranged differently.

Figure 4:
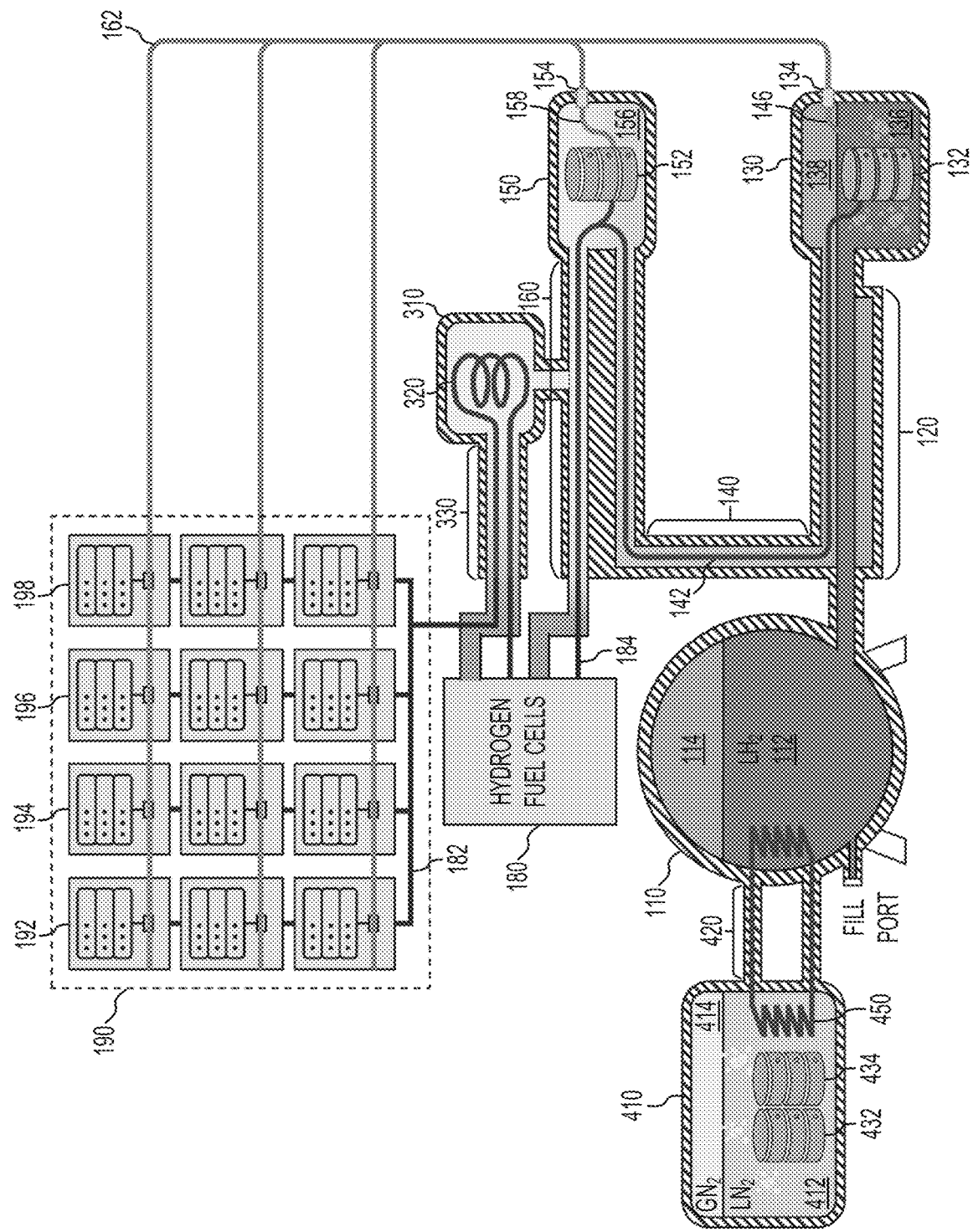
FIG. 4 shows a diagram of another example of waste cold recuperation in a fuel cell based power generation system environment including a datacenter load.

FIG. 4 shows a diagram of another example of waste cold recuperation in a fuel cell based power generation system environment 400 including a datacenter load 190. System environment 400 includes similar components as described earlier with respect to system environment 100 of FIG. 1 and system environment 300 of FIG. 3. In those instances where the components are identical or substantially similar with respect to FIGS. 1 and 3 and FIG. 4, the same reference numbers as used in FIG. 1 and FIG. 3 are used in FIG. 4. Accordingly, those components are not described in detail again with respect to system environment 400. This example of waste cold recuperation in a fuel cell based power generation system environment 400 includes additional liquefied nitrogen ($LN_2$)-cooled compute resources that are cooled via a heat-exchanger coupled with liquefied hydrogen storage 110. In this example, a vacuum-insulated cryostat 410 is coupled to liquefied hydrogen storage 110 via a vacuum-insulated cryostat segment 420. Vacuum-insulated cryostat 410 includes liquefied nitrogen ($LN_2$) 412 and gaseous nitrogen ($GN_2$) 414. Liquefied nitrogen ($LN_2$) 412 is used to cool compute resources 432 and 434. Liquefied nitrogen ($LN_2$) 412 is cooled by the liquefied hydrogen using a heat-exchanger 450. This allows additional extraction of waste cold from the liquefied hydrogen. As shown in FIG. 4, some of the liquefied nitrogen ($LN_2$) 412 changes from the liquid phase to a vapor phase and becomes gaseous nitrogen ($GN_2$) 414. Although FIG. 4 shows a certain number of components of system environment 400 arranged in a certain manner, there could be more or fewer number of components arranged differently.

Figure 5:
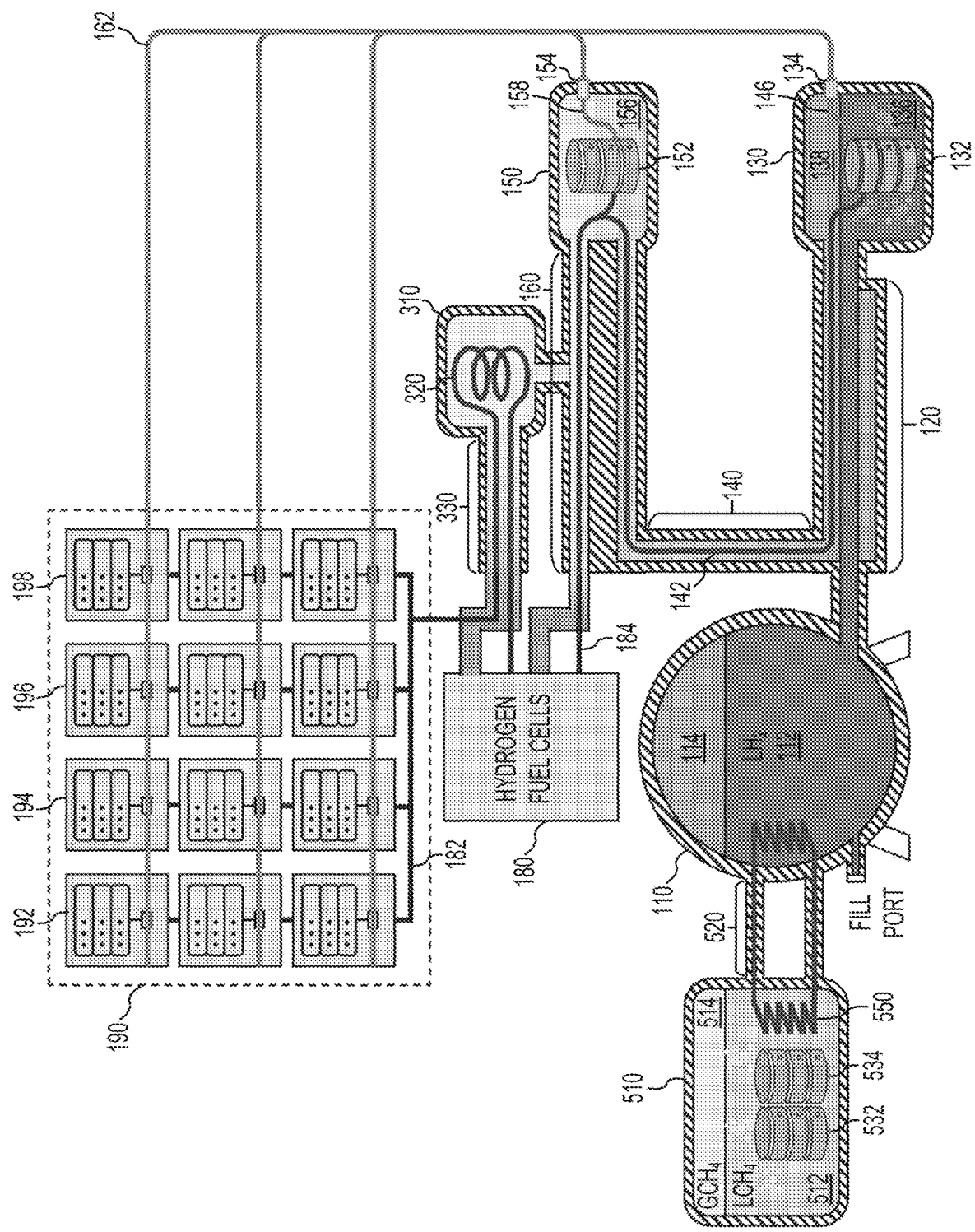
FIG. 5 shows a diagram of another example of waste cold recuperation in a fuel cell based power generation system environment including a datacenter load.

FIG. 5 shows a diagram of another example of waste cold recuperation in a fuel cell based power generation system environment 500 including a datacenter load 190. System environment 500 includes similar components as described earlier with respect to system environment 100 of FIG. 1 and system environment 300 of FIG. 3. In those instances where the components are identical or substantially similar with respect to FIGS. 1 and 3 and FIG. 5, the same reference numbers as used in FIG. 1 and FIG. 3 are used in FIG. 5. Accordingly, those components are not described in detail again with respect to system environment 500. This example of waste cold recuperation in a fuel cell based power generation system environment 500 includes additional liquefied natural gas (methane ($LCH_4$))-cooled compute resources that are cooled via a heat-exchanger coupled with liquefied hydrogen storage 110. In this example, a vacuum-insulated cryostat 510 is coupled to liquefied hydrogen storage 110 via a vacuum-insulated cryostat segment 520. Vacuum-insulated cryostat 510 includes liquefied natural gas (methane ($LCH_4$)) 512 and gaseous natural gas (methane ($GCH_4$)) 514. Liquefied methane ($LCH_4$) 512 is used to cool compute resources 532 and 534. Liquefied methane ($LCH_4$) 512 is cooled by the liquefied hydrogen using a heat-exchanger 550. This allows additional extraction of waste cold from the liquefied hydrogen. As shown in FIG. 5, some of the liquefied methane ($LCH_4$) 512 changes from the liquid phase to a vapor phase and becomes gaseous natural gas (methane ($GCH_4$)) 514. Although FIG. 5 shows a certain number of components of system environment 500 arranged in a certain manner, there could be more or fewer number of components arranged differently.

Figure 6:
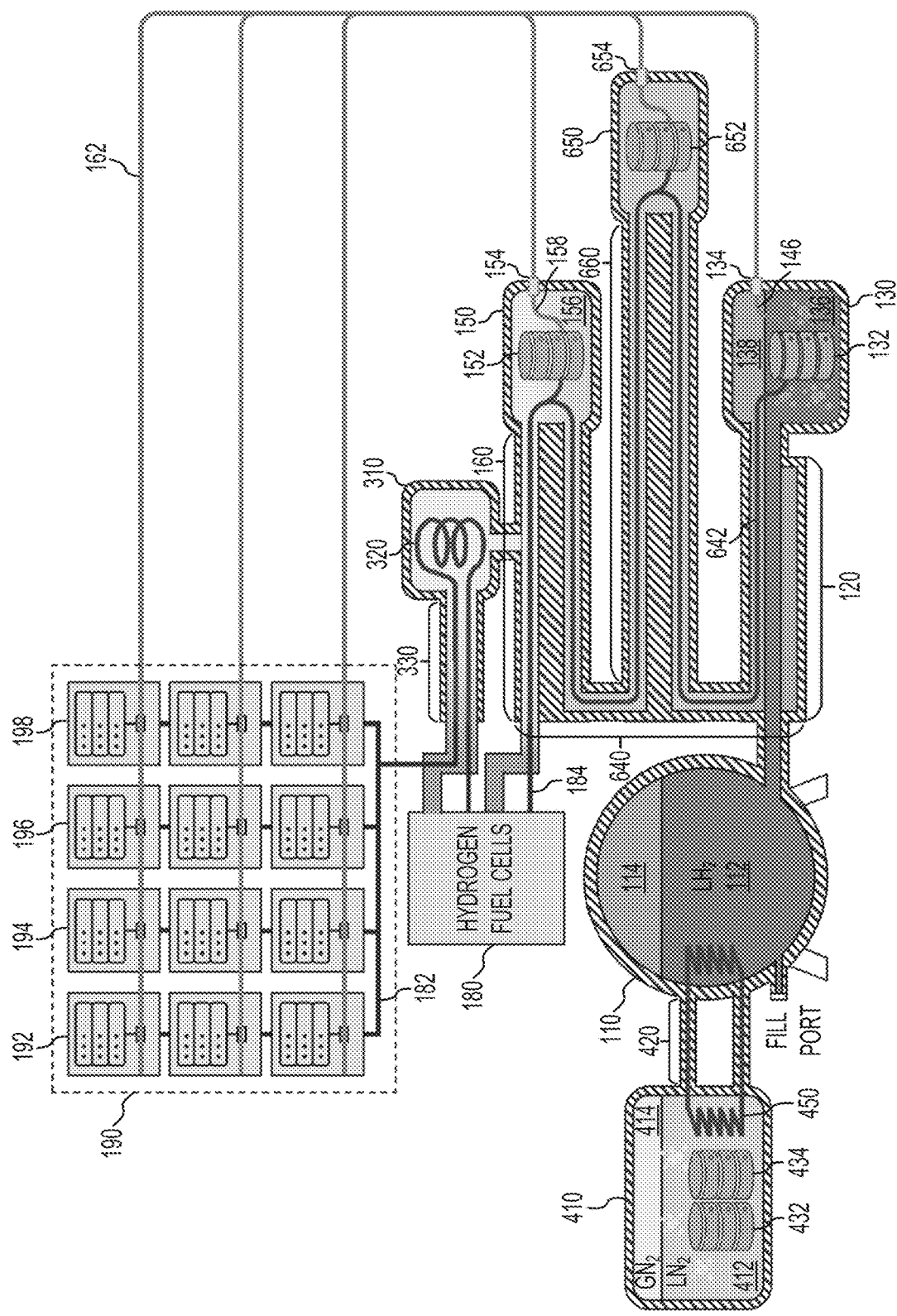
FIG. 6 shows a diagram of another example of waste cold recuperation in a fuel cell based power generation system environment including a datacenter load.

FIG. 6 shows a diagram of another example of waste cold recuperation in a fuel cell based power generation system environment 600 including a datacenter load 190. System environment 600 includes similar components as described earlier with respect to system environment 100 of FIG. 1, system environment 300 of FIG. 3, and system environment 400 of FIG. 4. In those instances where the components are identical or substantially similar with respect to FIGS. 1, 3, and 4 and FIG. 6, the same reference numbers as used in FIGS. 1, 3, and 4 are used in FIG. 6. Accordingly, those components are not described in detail again with respect to system environment 600. This example of waste cold recuperation in a fuel cell based power generation system environment 600 includes additional cold compute that is cooled by the vapor phase of liquefied hydrogen. This allows additional extraction of waste cold from the liquefied hydrogen.

In this example, the vacuum-insulated cryostat segment 140 of FIG. 1 is extended to allow for the connection with another vacuum-insulated cryostat segment 660. Vacuum-insulated cryostat segment 660 may be coupled to vacuum-insulated cryostat 650 housing compute resources 652. Compute resources 652 may be configured to operate in a cryogenic environment within a temperature range similar to the compute resources 152 of FIG. 1. As explained earlier with respect to FIG. 1, at least some of the liquefied hydrogen when used for cooling compute resources 132 boils and its phase changes from a liquid phase 136 to a vapor phase 138. The vapor phase 138 is then used to cool compute resources 652 in a similar manner as it is used to cool compute resources 152. Vacuum-insulated cryostat 650 may include a fiber-optic feed-through 654 for optical communication between compute resources 652 and one or more of compute resources 192, compute resources 194, compute resources 196, and compute resources 198 via optical network 162. Although FIG. 6 shows a certain number of components of system environment 600 arranged in a certain manner, there could be more or fewer number of components arranged differently.

Figure 7:
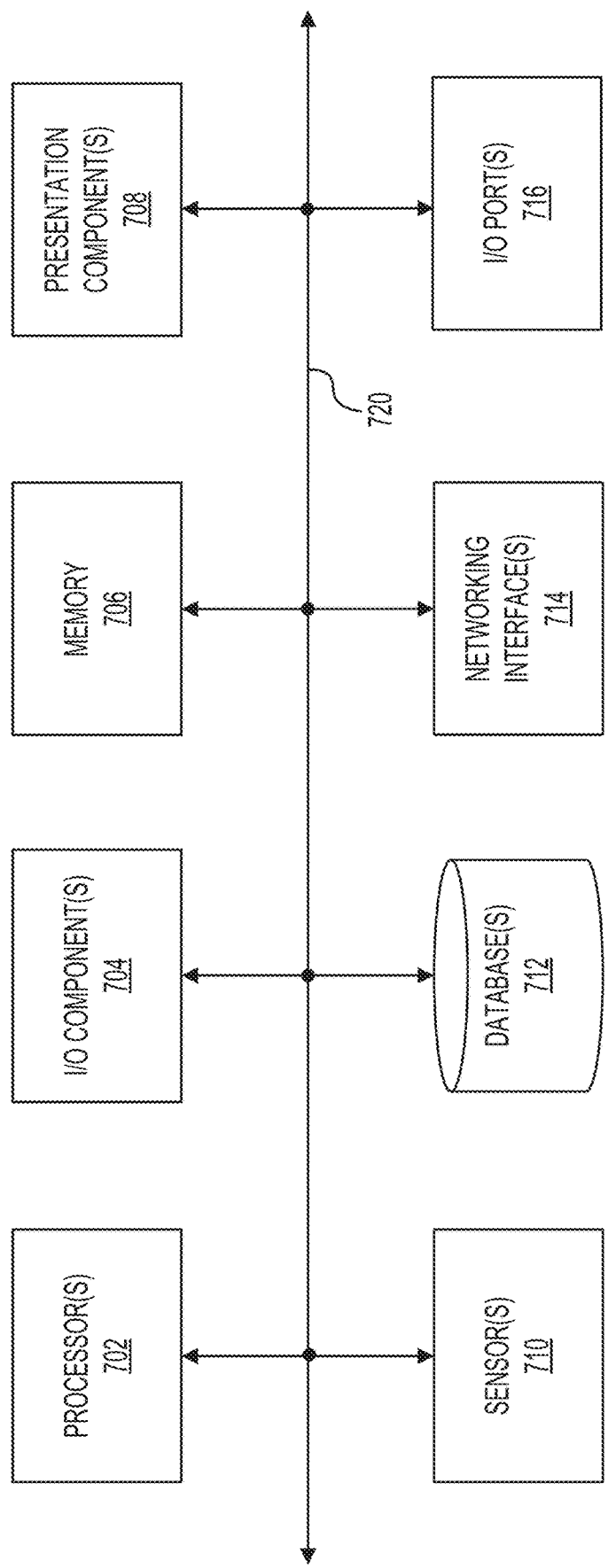
FIG. 7 shows a diagram of a control system for use in waste cold recuperation as part of a fuel cell based power generation system in accordance with one example.

FIG. 7 shows a diagram of an example control system 700 for use in waste cold recuperation as part of the fuel cell based power generation systems described with respect to FIGS. 1-6. As an example, control system 700 may allow for the implementation of control actions associated with sensing and controlling circulation pumps, temperature sensors, pressure sensors, level sensors, flow sensors, liquid/vapor fraction sensors, valves, pressure actuators, and/or other components of the systems described herein, as needed. Control system 700 may include a processor(s) 702, I/O component(s) 704, memory 706, presentation component(s) 708, sensors 710, database(s) 712, networking interfaces 714, and I/O port(s) 716, which may be interconnected via one or more bus systems 720.

Processor(s) 702 may execute instructions stored in memory 706. Processor(s) 702 may include CPUs, GPUs, ASICs, FPGAS, PLCs, DDCs, or other types of logic configured to execute instructions. I/O component(s) 704 may include components such as a keyboard, a mouse, a voice recognition processor, or touch screens. Memory 706 may be any combination of non-volatile storage or volatile storage (e.g., flash memory, DRAM, SRAM, ferro-magnetic memories, superconducting memories, or other types of memories). Presentation component(s) 708 may include displays, holographic devices, or other presentation devices. Displays may be any type of display, such as LCD, LED, or other types of display. Sensor(s) 710 may include telemetry or other types of sensors configured to detect, and/or receive, information (e.g., conditions associated with the components in the system environments described herein). Sensor(s) 710 may include sensors configured to sense conditions associated with the various components of the system environments described herein, such as system environment 100 of FIG. 1. As an example, sensors 710 may include temperature sensors, pressure sensors, level sensors, flow sensors, liquid/vapor fraction sensors, voltage sensors, current sensors, and other sensors needed to operate the systems and methods associated with waste cold recuperation in a safe and efficient manner.

Still referring to FIG. 7, database(s) 712 may be used to store any of the data or files as needed for the performance of methods described herein. Database(s) 712 may be implemented as a collection of distributed databases or as a single database. Network interface(s) 714 may include communication interfaces, such as Ethernet, cellular radio, Bluetooth radio, UWB radio, or other types of wireless or wired communication interfaces. I/O port(s) 716 may include Ethernet ports, Fiber-optic ports, wireless ports, or other communication ports.

Instructions corresponding to various control and management aspects related to waste cold recuperation and the system environments described herein may be stored in memory 706 or another memory. These instructions when executed by processor(s) 702, or other processors, may provide at least some of the control and management functionality associated with the systems described herein. Other control functionality may be implemented using dedicated controllers and other lower level control systems. The instructions could be encoded as hardware or software that may be stored in memory 706. Indeed, the functionality associated with control system 700 may be implemented using any appropriate combination of hardware, software, or firmware. Although FIG. 7 shows control system 700 as including a certain number of components arranged and coupled in a certain way, it may include fewer or additional components arranged and coupled differently. In addition, the functionality associated with control system 700 may be distributed or combined, as needed.

FIG. 8 shows a flowchart 800 of a method associated with waste cold recuperation in a fuel cell based power generation system in accordance with one example. The various steps shown as part of flowchart 800 may be executed by in the system environments described earlier with respect to FIGS. 1 and 2-6 by at least the instructions associated with control system 700 described earlier. Other control functionality may be implemented using dedicated controllers and other lower level control systems. Step 810 may include supplying liquefied gas to a first set of compute resources configurable to operate in a first cryogenic environment within a first temperature range from a first temperature value to a second temperature value higher than the first temperature value, where the liquefied gas is supplied as a coolant to cool the first set of compute resources, resulting in at least some of the liquefied gas becoming a vapor phase of the liquefied gas. As explained earlier with respect to FIGS. 1-7, any of the systems environments 100 and 300-600 may include components to allow for the execution of this step. As an example, with respect to system environment 100 of FIG. 1, liquefied gas may be liquefied hydrogen that may be supplied to compute resources 132 that are configured to operate in a cryogenic environment. Liquefied hydrogen may be used to cool these compute resources, resulting in some of the liquefied hydrogen becoming a vapor phase of the liquefied hydrogen. As explained earlier, aside from hydrogen other gasses, such as LNG may be used.

Step 820 may include supplying at least some of the vapor phase of the liquefied gas to a second set of compute resources configurable to operate in a second cryogenic environment within a second temperature range from a third temperature value to a fourth temperature value higher than the third temperature value, wherein the third temperature value is equal to or higher than the second temperature value, and wherein the at least some of the vapor phase of the liquefied gas is supplied as a coolant to cool the second set of compute resources, resulting in the at least some of the vapor phase of the liquefied gas becoming a super-heated vapor phase of the liquefied gas. As explained earlier with respect to FIGS. 1-7, any of the systems environments 100 and 300-600 may include components to allow for the execution of this step. As an example, with respect to system environment 100 of FIG. 1, the vapor phase of the liquefied gas may be the vapor phase of the liquefied hydrogen that may be supplied to compute resources 152 that are configured to operate in a cryogenic environment. The vapor phase of the hydrogen may be used to cool these compute resources, resulting in the vapor phase of the liquefied hydrogen becoming a super-heated vapor phase of the liquefied hydrogen. As explained earlier, aside from hydrogen other gasses, such as LNG may be used.

Step 830 may include supplying at least some of the super-heated vapor phase of the liquefied gas as fuel to fuel cells for providing electrical power to a datacenter load including compute resources configurable to operate in a non-cryogenic environment. As explained earlier with respect to FIGS. 1-7, any of the systems environments 100 and 300-600 may include components to allow for the execution of this step. As an example, with respect to system environment 100 of FIG. 1, the super-heated vapor phase of the liquefied gas may be the super-heated vapor phase of the liquefied hydrogen that may be fed as fuel to the hydrogen fuel cells for providing electrical power to a datacenter load 190 of FIG. 1, including compute resources configured to operate in a non-cryogenic environment. As explained earlier, unlike the waste cold recuperation systems and methods described herein, liquefied hydrogen is traditionally vaporized and warmed up in a series of ambient vaporizers. As a result, a large portion of the liquid hydrogen energy that is stored thermally as a cryogen is not recovered. This is because in such systems, the latent heat of hydrogen vaporization and the sensible heat of cold hydrogen gas are lost as waste cold. This constitutes an inefficiency in the energy supply chain for use with datacenter loads since hydrogen liquefication is an energy-intensive process. The method described with respect to flow chart 800 of FIG. 8 alleviates some of these inefficiencies by operating the waste cold recuperation system for recovering energy from the liquefied hydrogen before it is fed as fuel to the fuel cells used for powering the datacenter load.

FIG. 9 shows example dynamic control of waste cold recuperation in a fuel cell based power generation system environment including a datacenter load. This example of dynamic control relates to the waste cold recuperation in a fuel cell based power generation system described with respect to system environment 600 of FIG. 6. As an example, the various control and sensing operations associated with this example can be performed using control system 700 of FIG. 7. As shown in box 904, the total power consumption in the system environment by the various loads is determined based on the total power consumed by datacenter load 190 of FIG. 6 (box 902) and the power consumed by the various cold compute resources in system environment 600 of FIG. 6. In this example, such power consumption includes the power consumption of compute resources 132 of FIG. 6 (box 912), the power consumption of compute resources 152 of FIG. 6 (box 914), and the power consumption of compute resources 652 of FIG. 6 (box 916).

With continued reference to FIG. 9, the power consumption of the warm compute resources (e.g., compute resources associated with datacenter load 190 of FIG. 6) and the cold compute resources (e.g., compute resources 132, 152, and 652 of FIG. 6) can then be used to either calculate or look up the corresponding flow rate (e.g., mass flow rate) required to cool the respective warm and cold compute resources. As an example, calculation 1 shown in the box labeled as LEGEND can be used to determine the amount of liquefied gas (e.g., $LH_2$) that is required to generate the given amount of power for the fuel cells. That amount can then be translated into a mass flow rate using a calculation or by looking up a table or another data structure. In this example, the required $LH_2$ mass flow rate required to be supplied as fuel to the fuel cells (e.g., hydrogen fuel cells 180 of FIG. 6) is labeled as A (box 906). Similarly, using calculation 2 shown in the box labeled as LEGEND can be used to determine the amount of liquefied gas (e.g., $LH_2$) that is required to cool compute resources 132 of FIG. 6 (e.g., by extracting the cold waste associated with latent heat from the liquefied gas). That amount can then be translated into a mass flow rate using a calculation or by looking up a table or another data structure. In this example, the required $LH_2$ mass flow rate to cool compute resources 132 of FIG. 6 is labeled as B (box 922). Similarly, using calculation 3 shown in the box labeled as LEGEND can be used to determine the amount of liquefied gas (e.g., $LH_2$) that is required to cool compute resources 152 of FIG. 6 (e.g., by extracting the cold waste associated with sensible heat from the liquefied gas). That amount can then be translated into a mass flow rate using a calculation or by looking up a table or another data structure. In this example, the required $LH_2$ mass flow rate to cool compute resources 152 of FIG. 6 is labeled as C (box 924). Finally, using calculation 4 shown in the box labeled as LEGEND can be used to determine the amount of liquefied gas (e.g., $LH_2$) that is required to cool compute resources 652 of FIG. 6 (e.g., by extracting the cold waste associated with sensible heat from the liquefied gas). That amount can then be translated into a mass flow rate using a calculation or by looking up a table or another data structure. In this example, the required $LH_2$ mass flow rate to cool compute resources 652 of FIG. 6 is labeled as D (box 926).

Still referring to FIG. 9, the box labeled as DYNAMIC CONTROL shows example control logic that can be used for dynamically modifying the load presented by the cold compute resources to ensure a sufficient amount of fuel being supplied to datacenter load 190 of FIG. 6. Modifications of the load presented by such compute resources may be accomplished by taking some of the cold compute resources offline, such that they are no longer operational. Alternatively, the load may be reduced by throttling the output of such cold compute resources. In one example, the control logic associated with the dynamic control may be implemented using control system 700 of FIG. 7. Such control may allow for both fully automatic control, partially automatic control, or manual control. As an example, software or other instructions for implementing the dynamic control may reduce or increase load based on the values associated with respective mass flow rates. As an example, if the mass flow rate B is greater than the mass flow rate A, then the load associated with compute resources 132 of FIG. 6 may be reduced. Alternatively, if the mass flow rate B is lower than mass flow rate A, then the load associated with compute resources 132 of FIG. 6 may be increased, as needed. As another example, if the mass flow rate C is greater than the mass flow rate A, then the load associated with compute resources 152 of FIG. 6 may be reduced. Alternatively, if the mass flow rate C is lower than mass flow rate A, then the load associated with compute resources 152 of FIG. 6 may be increased, as needed. As yet another example, if the mass flow rate D is greater than the mass flow rate A, then the load associated with compute resources 652 of FIG. 6 may be reduced. Alternatively, if the mass flow rate D is lower than mass flow rate A, then the load associated with compute resources 652 of FIG. 6 may be increased, as needed. Similar dynamic control may be implemented with respect to any of the system environments described herein, including system environment 100 of FIG. 1, system environment 300 of FIG. 3, system environment 400 of FIG. 4, and system environment 500 of FIG. 5. Although FIG. 9 describes a specific example of dynamic control for varying the load in response the mass flow rate, other types of dynamic control may also be implemented. As an example, the mass flow rates may be varied based on the changes in the load or the expected changes in the load.

In conclusion, in one example, the present disclosure relates to a waste cold recuperation system including a liquefied gas storage for supplying liquefied gas as a coolant to cool a first set of compute resources configurable to operate in a first cryogenic environment within a first temperature range from a first temperature value to a second temperature value higher than the first temperature value, resulting in at least some of the liquid phase of the liquefied gas becoming a vapor phase of the liquefied gas. The waste cold recuperation system may further be configurable to supply at least some of the vapor phase of the liquefied gas as a coolant to cool a second set of compute resources configurable to operate in a second cryogenic environment within a second temperature range from a third temperature value to a fourth temperature value higher than the third temperature value, where the third temperature value is equal to or higher than the second temperature value, resulting in the at least some of the vapor phase of the liquefied gas becoming a super-heated vapor phase of the liquefied gas.

The waste cold recuperation system may further be configurable to supply at least some of the super-heated vapor phase of the liquefied gas as fuel to fuel cells for providing electrical power to a datacenter load including compute resources configurable to operate in a non-cryogenic environment. The waste cold is related to the latent heat associated with a change in the form of the liquefied gas from a liquid phase to a vapor phase. The waste cold is further related to the sensible heat associated with a heating of the vapor phase of the liquefied gas to the super-heated vapor phase of the liquefied gas.

The liquefied gas storage may be configured as a vacuum-insulated housing. The liquefied gas storage may be coupled via a first segment of a vacuum-insulated cryostat to the first set of compute resources. The first set of compute resources may be coupled via a second segment of the vacuum-insulated cryostat to the second set of compute resources. The second set of compute resources may be coupled via a third segment of the vacuum-insulated cryostat to a pipe for supplying the super-heated vapor phase of the liquefied gas to the fuel cells.

The waste cold recuperation system may further be configurable to dynamically control an amount of the liquefied gas being supplied as the coolant in order to ensure a sufficient amount of fuel is being supplied to the fuel cells for providing the electrical power to the datacenter load including the compute resources configurable to operate in the non-cryogenic environment. In this example, the first set of compute resources may comprise at least quantum computing resources, and the second set of compute resources may comprise at least complimentary metal-oxide-semiconductor (CMOS) computing systems.

In another example, the present disclosure relates to a method for operating a waste cold recuperation system for recovering energy from liquefied gas. The method may include supplying the liquefied gas to a first set of compute resources configurable to operate in a first cryogenic environment within a first temperature range from a first temperature value to a second temperature value higher than the first temperature value, where the liquefied gas is supplied as a coolant to cool the first set of compute resources, resulting in at least some of the liquefied gas becoming a vapor phase of the liquefied gas.

The method may further include supplying at least some of the vapor phase of the liquefied gas to a second set of compute resources configurable to operate in a second cryogenic environment within a second temperature range from a third temperature value to a fourth temperature value higher than the third temperature value, where the third temperature value is equal to or higher than the second temperature value, and where the at least some of the vapor phase of the liquefied gas is supplied as a coolant to cool the second set of compute resources, resulting in the at least some of the vapor phase of the liquefied gas becoming a super-heated vapor phase of the liquefied gas. The method may further include supplying at least some of the super-heated vapor phase of the liquefied gas as fuel to fuel cells for providing electrical power to a datacenter load including compute resources configurable to operate in a non-cryogenic environment.

The waste cold is related to the latent heat associated with a change in the form of the liquefied gas from a liquid phase to a vapor phase. The waste cold is further related to the sensible heat associated with a heating of the vapor phase of the liquefied gas to the super-heated vapor phase of the liquefied gas.

A liquefied gas storage may be configured to store the liquefied gas, and the liquefied gas storage may be configured as a vacuum-insulated housing. The liquefied gas storage may be coupled via a first segment of a vacuum-insulated cryostat to the first set of compute resources configured to operate in the first cryogenic environment. The first set of compute resources, configured to operate in the first cryogenic environment, may be coupled via a second segment of the vacuum-insulated cryostat to the second set of compute resources configured to operate in the second cryogenic environment. The second set of compute resources, configured to operate in the second cryogenic environment, may be coupled via a third segment of the vacuum-insulated cryostat to the hydrogen fuel cells. In this example, the first set of compute resources may comprise at least quantum computing resources, and the second set of compute resources may comprise at least complimentary metal-oxide-semiconductor (CMOS) computing systems.

In yet another example, the present disclosure relates to a waste cold recuperation system including a first set of compute resources configured to operate in a first cryogenic environment within a first temperature range from 20 kelvin to 77 kelvin. The waste cold recuperation system may further include a second set of compute resources configured to operate in a second cryogenic environment within a second temperature range from 77 kelvin to 100 kelvin.

Liquefied hydrogen may be supplied as a coolant to cool the first set of compute resources, resulting in at least some of the liquefied hydrogen becoming a vapor phase of the liquefied hydrogen. At least the vapor phase of the liquefied hydrogen may be supplied as a coolant to cool the second set of compute resources, resulting in the vapor phase of the liquefied hydrogen becoming a super-heated vapor phase of the liquefied hydrogen. The super-heated vapor phase of the liquefied hydrogen may be fed as fuel to hydrogen fuel cells for providing electrical power to a datacenter load including compute resources configured to operate in a non-cryogenic environment.

The waste cold is related to the latent heat associated with a change in the form of the liquefied hydrogen from a liquid phase to a vapor phase. The waste cold is further related to the sensible heat associated with a heating of the vapor phase of the liquefied hydrogen to the super-heated vapor phase of the liquefied hydrogen.

A liquefied hydrogen storage may be configured to store the liquefied hydrogen and supply the liquefied hydrogen, where the liquefied hydrogen storage is configured as a vacuum-insulated housing. The liquefied hydrogen storage may be coupled via a first segment of a vacuum-insulated cryostat to the first set of compute resources configured to operate in the first cryogenic environment. The first set of compute resources, configured to operate in the first cryogenic environment, may be coupled via a second segment of the vacuum-insulated cryostat to the second set of compute resources configured to operate in the second cryogenic environment. The second set of compute resources, configured to operate in the second cryogenic environment, may be coupled via a third segment of the vacuum-insulated cryostat to the hydrogen fuel cells.

The waste cold recuperation system may further include a superconducting magnetic energy storage (SMES) system, which is also cooled using the waste cold. The waste cold recuperation system may further include a third set of compute resources, configured to operate in a cryogenic environment, that is cooled using liquefied nitrogen coupled to the liquefied hydrogen via a heat exchanger. Alternatively, or additionally, the waste cold recuperation system may further include yet another set of compute resources, configured to operate in a cryogenic environment, that is cooled using liquefied natural gas coupled to the liquefied hydrogen via a heat exchanger.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), Programmable Logic Controllers (PLCs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A waste cold recuperation system comprising:
a liquefied gas storage for supplying liquefied gas as a coolant to cool a first set of compute resources configured to operate in a first cryogenic environment within a first temperature range from a first temperature value to a second temperature value higher than the first temperature value, resulting in at least some of the liquefied gas becoming a vapor phase of the liquefied gas;
wherein the waste cold recuperation system is configured to supply at least some of the vapor phase of the liquefied gas as a coolant to cool a second set of compute resources configured configured to operate in a second cryogenic environment within a second temperature range from a third temperature value to a fourth temperature value higher than the third temperature value, wherein the third temperature value is equal to or higher than the second temperature value, resulting in the at least some of the vapor phase of the liquefied gas becoming a super-heated vapor phase of the liquefied gas; and
wherein the waste cold recuperation system is further configured to supply at least some of the super-heated vapor phase of the liquefied gas as fuel to fuel cells for providing electrical power to a datacenter load including compute resources configured to operate in a non-cryogenic environment, wherein the liquefied gas storage is coupled via a first segment of a vacuum-insulated cryostat to the first set of compute resources, wherein the first set of compute resources is coupled via a second segment of the vacuum-insulated cryostat to the second set of compute resources, and wherein the second set of compute resources is coupled via a third segment of the vacuum-insulated cryostat to a pipe for supplying the super-heated vapor phase of the liquefied gas to the fuel cells.

2. The waste cold recuperation system of claim 1, wherein waste cold is related to latent heat associated with a change in the form of the liquefied gas from a liquid phase to a vapor phase.

3. The waste cold recuperation system of claim 2, wherein the waste cold is further related to sensible heat associated with a heating of the vapor phase of the liquefied gas to the super-heated vapor phase of the liquefied gas.

4. The waste cold recuperation system of claim 1, wherein the liquefied gas storage is configured as a vacuum-insulated housing.

5. The waste cold recuperation system of claim 1, wherein the waste cold recuperation system is further configured to dynamically control an amount of the liquefied gas being supplied as the coolant in order to ensure a sufficient amount of fuel is being supplied to the fuel cells for providing the electrical power to the datacenter load including the compute resources configured to operate in the non-cryogenic environment.

6. The waste cold recuperation system of claim 1, wherein the first set of compute resources comprises at least quantum computing resources, and wherein the second set of compute resources comprises at least complimentary metal-oxide-semiconductor (CMOS) computing systems.

7. The waste cold recuperation system of claim 1, wherein the first temperature value ranges between 20 kelvin to 77 kelvin and the second temperature value ranges between 77 kelvin to 100 kelvin.

8. The waste cold recuperation system of claim 7, further comprising a superconducting magnetic energy storage (SMES) system, which is also cooled using waste cold.

9. A method for operating a waste cold recuperation system for recovering energy from liquefied gas, the method comprising:
supplying the liquefied gas to a first set of compute resources configured to operate in a first cryogenic environment within a first temperature range from a first temperature value to a second temperature value higher than the first temperature value, wherein the liquefied gas is supplied as a coolant to cool the first set of compute resources, resulting in at least some of the liquefied gas becoming a vapor phase of the liquefied gas, and wherein a liquefied gas storage is coupled via a first segment of a vacuum-insulated cryostat to the first set of compute resources configured to operate in the first cryogenic environment;
supplying at least some of the vapor phase of the liquefied gas to a second set of compute resources configured to operate in a second cryogenic environment within a second temperature range from a third temperature value to a fourth temperature value higher than the third temperature value, wherein the third temperature value is equal to or higher than the second temperature value, wherein at least some of the vapor phase of the liquefied gas is supplied as a coolant to cool the second set of compute resources, resulting in the at least some of the vapor phase of the liquefied gas becoming a super-heated vapor phase of the liquefied gas, wherein the first set of compute resources configured to operate in the first cryogenic environment is coupled via a second segment of the vacuum-insulated cryostat to the second set of compute resources configured to operate in the second cryogenic environment, and wherein the second set of compute resources configured to operate in the second cryogenic environment is coupled via a third segment of the vacuum-insulated cryostat to the hydrogen fuel cells; and
supplying at least some of the super-heated vapor phase of the liquefied gas as fuel to fuel cells for providing electrical power to a datacenter load including compute resources configured to operate in a non-cryogenic environment.

10. The method of claim 9, wherein waste cold is related to latent heat associated with a change in the form of the liquefied gas from a liquid phase to a vapor phase, and wherein the waste cold is further related to sensible heat associated with a heating of the vapor phase of the liquefied gas to the super-heated vapor phase of the liquefied gas.

11. The method of claim 9, wherein the liquefied gas storage is configured to store the liquefied gas, and wherein the liquefied gas storage is configured as a vacuum-insulated housing.

12. The method of claim 9, wherein the first set of compute resources comprises at least quantum computing resources, and wherein the second set of compute resources comprises at least complimentary metal-oxide-semiconductor (CMOS) computing systems.

13. The method of claim 9, wherein the first temperature value ranges between 20 kelvin to 77 kelvin and the second temperature value ranges between 77 kelvin to 100 kelvin.

14. The method of claim 13, wherein the waste cold recuperation system further comprises a superconducting magnetic energy storage (SMES) system, and wherein the method further comprises cooling the SMES system using waste cold.

15. A waste cold recuperation system comprising:
a first set of compute resources configured to operate in a first cryogenic environment within a first temperature range from 20 kelvin to 77 kelvin;
a second set of compute resources configured to operate in a second cryogenic environment within a second temperature range from 77 kelvin to 100 kelvin,
wherein liquefied hydrogen is supplied as a coolant to cool the first set of compute resources, resulting in at least some of the liquefied hydrogen becoming a vapor phase of the liquefied hydrogen, wherein at least the vapor phase of the liquefied hydrogen is supplied as a coolant to cool the second set of compute resources, resulting in the vapor phase of the liquefied hydrogen becoming a super-heated vapor phase of the liquefied hydrogen, and wherein the super-heated vapor phase of the liquefied hydrogen is fed as fuel to hydrogen fuel cells for providing electrical power to a datacenter load including compute resources configured to operate in a non-cryogenic environment, wherein a liquefied hydrogen storage is coupled via a first segment of a vacuum-insulated cryostat to the first set of compute resources configured to operate in the first cryogenic environment, wherein the first set of compute resources configured to operate in the first cryogenic environment is coupled via a second segment of the vacuum-insulated cryostat to the second set of compute resources configured to operate in the second cryogenic environment, and wherein the second set of compute resources configured to operate in the second cryogenic environment is coupled via a third segment of the vacuum-insulated cryostat to the hydrogen fuel cells.

16. The waste cold recuperation system of claim 15, wherein waste cold is related to latent heat associated with a change in the form of the liquefied hydrogen from a liquid phase to a vapor phase, and wherein the waste cold is further related to sensible heat associated with a heating of the vapor phase of the liquefied hydrogen to the super-heated vapor phase of the liquefied hydrogen.

17. The waste cold recuperation system of claim 16, wherein the liquefied hydrogen storage is configured to store the liquefied hydrogen and supply the liquefied hydrogen.

18. The waste cold recuperation system of claim 17, further comprising a superconducting magnetic energy storage (SMES) system, which is also cooled using the waste cold.

19. The waste cold recuperation system of claim 18, further comprising a third set of compute resources, configured to operate in a cryogenic environment, that is cooled using liquefied nitrogen coupled to the liquefied hydrogen via a heat exchanger.

20. The waste cold recuperation system of claim 18, further comprising a third set of compute resources, configured to operate in a cryogenic environment, that is cooled using liquefied natural gas coupled to the liquefied hydrogen via a heat exchanger.

* * * * *